United States Patent [19]

Stockstad et al.

[11] Patent Number: 5,327,100
[45] Date of Patent: Jul. 5, 1994

[54] NEGATIVE SLEW RATE ENHANCEMENT CIRCUIT FOR AN OPERATIONAL AMPLIFIER

[75] Inventors: Troy L. Stockstad, Phoenix; Renwin J. Yee, Mesa; Thomas D. Petty, Tempe, all of Ariz.

[73] Assignee: Motorola, Inc., Schaumburg, Ill.

[21] Appl. No.: 24,142

[22] Filed: Mar. 1, 1993

[51] Int. Cl.$^5$ .............................................. H03F 3/45
[52] U.S. Cl. ..................................... 330/255; 330/257
[58] Field of Search ............... 330/255, 257, 261, 267, 330/268

[56] References Cited

U.S. PATENT DOCUMENTS

| | | | |
|---|---|---|---|
| 4,232,273 | 11/1980 | Leidich | 330/255 X |
| 4,922,208 | 5/1990 | Susak et al. | 330/255 |

FOREIGN PATENT DOCUMENTS

| | | | |
|---|---|---|---|
| 0144237 | 12/1978 | Japan | 330/255 |
| 0085607 | 5/1985 | Japan | 330/255 |

*Primary Examiner*—Steven Mottola
*Attorney, Agent, or Firm*—Robert D. Atkins

[57] ABSTRACT

An operational amplifier enhances its negative slew rate by providing more base current to a bottom PNP output drive transistor. A large signal applied at the inverting input of the operational amplifier unbalances the differential input stage and provides maximum current through a current mirror circuit to the base of the PNP output transistor. A transistor is biased on by sufficient current flow through the current mirror circuit to draw even more base current from the base of the PNP output transistor and thereby enhance its negative slew rate.

19 Claims, 2 Drawing Sheets

NEGATIVE SLEW RATE ENHANCEMENT CIRCUIT FOR AN OPERATIONAL AMPLIFIER

BACKGROUND OF THE INVENTION

The present invention relates to operational amplifiers, and more particularly, to an operational amplifier having a negative slew rate enhancement circuit.

Operational amplifiers (op amps) are well known in electronic circuit design. A conventional op amp receives first and second input signals at its inverting and non-inverting inputs and provides an output signal as an amplified difference of the first and second input signals. The first and second input signals are typically processed through one or more differential amplifier stages and then through a differential-to-single-ended converter. An output drive stage takes the single-ended output signal and enables upper and lower output drive transistors serially coupled between first and second power supply potentials. The upper drive transistor in the output drive stage may be an NPN-type device while the bottom drive transistor is a PNP-type device.

A significant problem inherent in most if not all op amps is the limited negative slew rate (rate of voltage change over time) of the bottom PNP drive transistor. The positive slew may reach 300 V/us while the negative slew rate is only 200 V/us. The current sinking capability of the bottom PNP drive transistor also tends to be lower than the upper NPN drive transistor. As the need for higher speed op amps continues to grow, it becomes advantageous to increase the negative slew rate and also to provide more current sinking capability.

DETAILED DESCRIPTION OF THE PREFERRED EMBODIMENT

Figure 1:
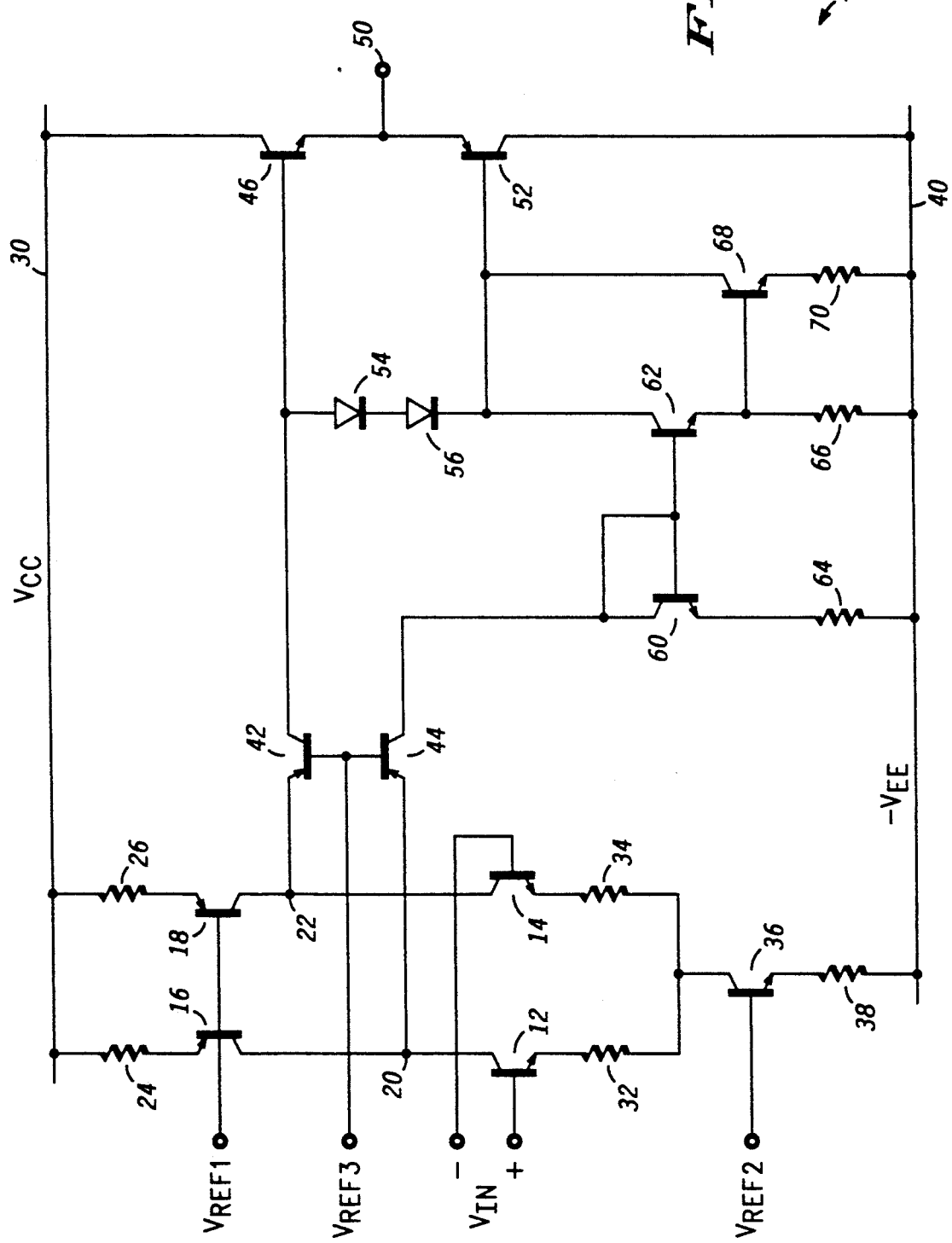
FIG. 1 is a schematic diagram illustrating a simplified operational amplifier with a negative slew rate enhancement circuit.

An op amp 10 is shown in FIG. 1 suitable for manufacturing as an integrated circuit using conventional integrated circuit processes. Op amp 10 receives first and second input signals $V_{IN}$ at the bases of transistors 12 and 14. The base of transistor 12 is the non-inverting input of op amp 10, and the base of transistor 14 is the inverting input. The collectors of transistors 12 and 14 are coupled to the collectors of current source transistors 16 and 18 at nodes 20 and 22, respectively. The emitters of transistors 16 and 18 are coupled through resistors 24 and 26 to power supply conductor 30 operating at a positive potential $V_{CC}$ such as 15 volts. The bases of transistors 16 and 18 receive reference voltage $V_{REF1}$ operating at say 14.2 volts. The emitters of transistors 12 and 14 are coupled together through resistors 32 and 34 to the collector of current source transistor 36. The base of transistor 36 receives reference voltage $V_{REF2}$ operating at say $-14.2$ volts, while the emitter of transistor 36 is coupled through resistor 38 to power supply conductor 40 operating at a negative potential $-V_{EE}$ such as $-15$ volts. Transistors 12, 14, 16, 18 and 36 form a differential input stage for op amp 10 receiving first and second input signals $V_{IN}$ and providing a differential voltage at nodes 20 and 22.

The differential signals developed at nodes 20 and 22 are also applied at the emitters of transistors 42 and 44. The bases of transistors 42 and 44 receive reference voltage $V_{REF3}$ operating at say 13.4 volts. The collector of transistor 42 is coupled to the base of NPN transistor 46 which includes a collector coupled to power supply conductor 30 and an emitter coupled to output 50 for providing an single-ended output signal. PNP transistor 52 includes a collector coupled to power supply conductor 40 and an emitter coupled to output 50 for pulling the singled-ended output signal in the negative direction. Diodes 54 and 56 are serially coupled between the base of transistor 46 and the base of transistor 52.

As part of the present invention, op amp 10 includes a current mirror circuit comprising transistors 60 and 62 where the collector of transistor 60 is coupled to the collector of transistor 44. The collector and base of transistor 60 are coupled to the base of transistor 62, while the collector of transistor 62 is coupled to the base of transistor 52. Resistors 64 and 66 are coupled between the emitters of transistors 60 and 62 and power supply conductor 40. Transistor 68 includes a collector coupled to the base of transistor 52, a base coupled to the emitter of transistor 62, and an emitter coupled through resistor 70 to power supply conductor 40.

The operation of op amp 10 proceeds as follows. If the difference between the first and second input signals $V_{IN}$ is made small, say less than 60 mv, the negative slew rate enhancement transistor 68 is inactive. For example, if the first input signal is slightly greater than the second input signal, transistor 12 conducts more current than transistor 14. The voltage at node 20 falls and the voltage at node 22 rises. With the fixed reference voltage $V_{REF3}$, the base-emitter junction potential ($V_{be}$) of transistor 42 increases causing it to conduct more current. Transistor 46 turns on harder as it receives more base current from transistor 42. The $V_{be}$ of transistor 44 decreases as node 20 falls. Transistor 44 provides less current into current mirror transistors 60-62 thereby drawing less current from the base of transistor 52. Thus, the signal level at output 50 increases. Resistors 64 and 66 are selected at say 625 ohms each to keep transistor 68 biased off. Resistor 70 is selected at a low value, say 10 ohms, for current limiting. Resistor 70 may be eliminated if current limiting is not needed. Thus, the negative slew rate enhancement is not needed for small signal operation.

If the first input signal is slightly less than the second input signal, transistor 14 conducts more current than transistor 12 and the voltage at node 20 rises as the voltage at node 22 falls. The $V_{be}$ of transistor 42 decreases causing it to conduct less current. Transistor 46 conducts less as it receives less base current from transistor 42. The $V_{be}$ of transistor 44 increases as node 20 rises. Transistor 44 provides more current into current mirror transistors 60-62 thereby drawing more current from the base of transistor 52. However, the voltage developed across resistor 66 is still not sufficient to bias transistor 68. The signal level at output 50 decreases albeit without negative slew rate enhancement.

Now consider a large signal difference between the first and second input signals, say greater than 60 mv. If the first input signal becomes much greater than the second input signal, transistor 12 conducts substantially all of the current flowing through current source transistors 16 and 36. The voltage at node 20 falls and the voltage at node 22 rises. Transistors 14 and 44 are substantially off. With the fixed reference voltage $V_{REF3}$, the $V_{be}$ of transistor 42 increases until it conducts all the current from current source transistor 18. Transistor 46 turns on hard as it receives maximum base current from transistor 42. Current mirror transistors 60-62 receive substantially no current with transistor 44 off. Transistors 52 and 68 are also off. The signal level at output 50 slews toward power supply conductor 30.

If the second input signal to the inverting input of op amp 10 is much greater than the first input signal, transistor 14 conducts substantially all of the current flowing through current source transistors 18 and 36. The voltage at node 20 rises as the voltage at node 22 falls. Transistors 12 and 42 are off. The $V_{be}$ of transistor 44 increases until it conducts all the current from current source transistor 16 into current mirror transistors 60-62 thereby drawing more current from the base of transistor 52. Now the voltage developed across resistor 66 in response to the output current flowing through mirror transistor 62 is sufficient to bias transistor 68 on. The signal level at output 50 decreases with an enhanced negative slew rate as transistor 68 draws more current from the base of transistor 52. Another transistor may be connected in parallel with transistor 68 for providing even greater base drive to transistor 52 in response to the voltage developed across resistor 66. Transistor 52 sinks more current from output 50 with greater base drive.

Thus, current mirror circuit 60-62 in combination with transistor 68 provide a drive signal to the base of transistor 52 upon sensing a predetermined level of the voltages at nodes 20 and 22. Current mirror 60-62 senses the predetermined voltage level and energizes transistor 68 to provide the addition drive to transistor 52 thereby enhancing negative slew rate.

Figure 2:
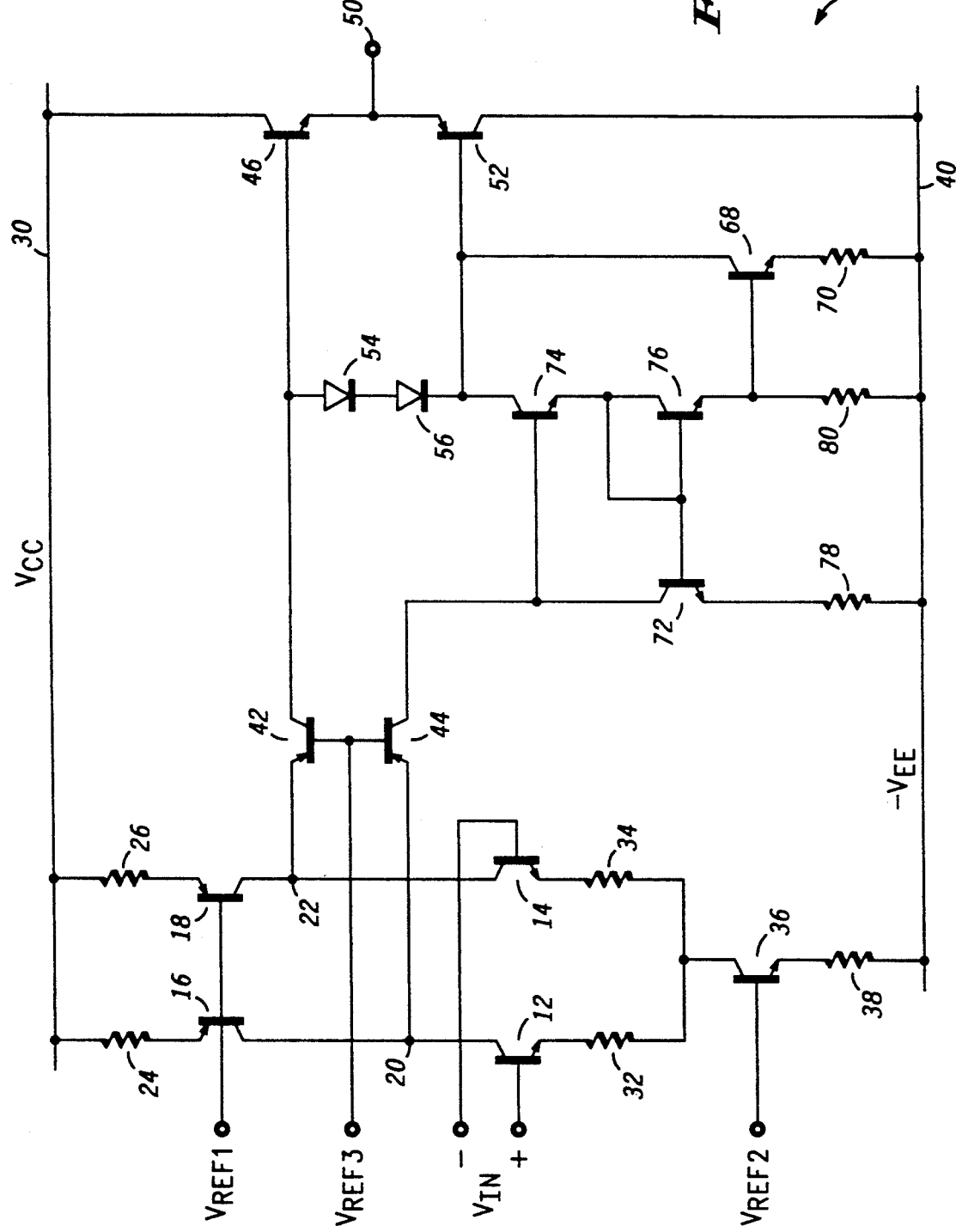
FIG. 2 is a schematic diagram illustrating an alternate embodiment of the negative slew rate enhancement circuit.

An alternate embodiment of op amp 10 is shown in FIG. 2 where current mirror transistors 60 and 62 are replaced with a "Wilson" current mirror circuit for improving base current cancellation and reducing offset. Components having a similar function are given the same reference number as used in FIG. 1. The collector of transistor 44 is coupled to the collector of transistor 72 and to the base of transistor 74. The collector and base of transistor 76 are coupled together to the base of transistor 72 and to the emitter of transistor 74. The collector of transistor 74 is coupled to the base of transistor 52, and the emitter of transistor 76 is coupled to the base of transistor 68. Resistors 78 and 80 are coupled between the emitters of transistors 72 and 76 and power supply conductor 40, respectively.

Again if the second input signal to the inverting input of op amp 10 is much greater than the first input signal, transistor 14 conducts substantially all of the current flowing through current source transistors 18 and 36. The voltage at node 20 rises as the voltage at node 22 falls. Transistors 12 and 42 are off. The $V_{be}$ of transistor 44 increases until it conducts all the current from current source transistor 16 into current mirror transistors 72-76 thereby drawing more current from the base of transistor 52. The voltage developed across resistor 66 in response to the output current flowing through mirror transistors 74 and 76 is sufficient to bias transistor 68 on. The signal level at output 50 decreases with an enhanced negative slew rate as transistor 68 draws more base current from transistor 52.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An operational amplifier, comprising:
    a differential input stage responsive to first and second input signals for developing first and second voltages at first and second nodes;
    a first transistor having a base, an emitter and a collector, said emitter being coupled to an output of the operational amplifier, said collector being coupled to a first power supply conductor, said base being coupled to said second node; and
    circuit means having first and second conduction paths coupled to said first and second nodes respectively, said second conduction path being further coupled to said base of said first transistor for providing a drive signal to said base of said first transistor upon sensing a predetermined level of said first and second voltages.

2. The operational amplifier of claim 1 wherein said circuit means includes:
    a current mirror circuit having a first conduction path coupled to said first node for receiving an input current and having a second conduction path coupled to said base of said first transistor for sinking an output current, said second conduction path of said current mirror circuit developing a voltage in response to said output current; and
    a second transistor having a base, an emitter and a collector, said base receiving said voltage from said current mirror circuit, said collector being coupled to said base of said first transistor, said emitter being coupled to said first power supply conductor.

3. The operational amplifier of claim 2 further including:
    a third transistor having a base, an emitter and a collector, said base receiving a first reference voltage, said emitter being coupled to said second node;
    a fourth transistor having a base, an emitter and a collector, said base receiving said first reference voltage, said emitter being coupled to said first node, said collector being coupled to said input of said current mirror circuit;
    a fifth transistor having a base, an emitter and a collector, said base being coupled to said collector of said third transistor, said collector being coupled to a second power supply conductor, said emitter being coupled to said output of the operational amplifier; and
    a first resistor coupled between said emitter of said second transistor and said first power supply conductor.

4. The operational amplifier of claim 3 wherein said current mirror circuit includes:
    a sixth transistor having a base, an emitter and a collector, said base and collector being coupled together to said collector of said fourth transistor;
    a second resistor coupled between said emitter of said sixth transistor and said first power supply conductor;
    a seventh transistor having a base, an emitter and a collector, said base being coupled to said base of said sixth transistor, said collector being coupled to said base of said first transistor, said emitter being coupled to said base of said second transistor; and a third resistor coupled between said emitter of said seventh transistor and said first power supply conductor.

5. The operational amplifier of claim 4 further including:
a first diode having an anode coupled to said base of said fifth transistor and having a cathode; and
a second diode having an anode coupled to said cathode of said first diode and having a cathode coupled to said base of said first transistor.

6. The operational amplifier of claim 5 wherein said differential input stage includes:
an eighth transistor having a base, an emitter and a collector, said base receiving said first input signal, said collector being coupled to said first node;
a ninth transistor having a base, an emitter and a collector, said base receiving a second reference voltage, said collector being coupled to said first node;
a fourth resistor coupled between said emitter of said ninth transistor and said second power supply conductor;
a tenth transistor having a base, an emitter and a collector, said base receiving a third reference voltage;
a fifth resistor coupled between said emitter of said tenth transistor and said first power supply conductor; and
a sixth resistor coupled between said emitter of said eighth transistor and said collector of said tenth transistor.

7. The operational amplifier of claim 6 wherein said differential input stage further includes:
an eleventh transistor having a base, an emitter and a collector, said base receiving said second input signal, said collector being coupled to said second node;
a twelfth transistor having a base, an emitter and a collector, said base receiving said second reference voltage, said collector being coupled to said second node;
a seventh resistor coupled between said emitter of said twelfth transistor and said second power supply conductor; and
an eighth resistor coupled between said emitter of said eleventh transistor and said collector of said tenth transistor.

8. An operational amplifier, comprising:
a differential input stage responsive to first and second input signals for developing first and second voltages at first and second nodes;
a first transistor having a base, an emitter and a collector, said emitter being coupled to an output of the operational amplifier, said collector being coupled to a first power supply conductor, said base being coupled for receiving said second voltage;
a current mirror circuit having a first conduction path coupled to said first node for receiving an input current and having a second conduction path coupled to said base of said first transistor for sinking an output current, said second conduction path of said current mirror circuit developing a voltage in response to said output current; and
a second transistor having a base, an emitter and a collector, said base receiving said voltage from said second conduction path of said current mirror circuit, said collector being coupled to said base of said first transistor, said emitter being coupled to said first power supply conductor.

9. The operational amplifier of claim 8 wherein said current mirror circuit includes:
a third transistor having a base, an emitter and a collector, said base and collector being coupled together to said first node, said emitter being coupled to said first power supply conductor; and
a fourth transistor having a base, an emitter and a collector, said base being coupled to said base of said third transistor, said collector being coupled to said base of said first transistor, said emitter being coupled to said first power supply conductor.

10. The operational amplifier of claim 9 further including:
a fifth transistor having a base, an emitter and a collector, said base receiving a first reference voltage, said emitter being coupled to said second node;
a sixth transistor having a base, an emitter and a collector, said base receiving said first reference voltage, said emitter being coupled to said first node, said collector being coupled to said collector of said second transistor; and
a seventh transistor having a base, an emitter and a collector, said base being coupled to said collector of said fifth transistor, said collector being coupled to a second power supply conductor, said emitter being coupled to said output of the operational amplifier.

11. The operational amplifier of claim 10 further including:
a first resistor coupled between said emitter of said second transistor and said first power supply conductor;
a third resistor coupled between said emitter of said third transistor and said first power supply conductor; and
a third resistor coupled between said emitter of said fourth transistor and said first power supply conductor.

12. The operational amplifier of claim 11 further including:
a first diode having an anode coupled to said base of said seventh transistor and having a cathode; and
a second diode having an anode coupled to said cathode of said first diode and having a cathode coupled to said base of said first transistor.

13. The operational amplifier of claim 12 wherein said differential input stage includes:
an eighth transistor having a base, an emitter and a collector, said base receiving said first input signal, said collector being coupled to said first node;
a ninth transistor having a base, an emitter and a collector, said base receiving a second reference voltage, said collector being coupled to said first node;
a fourth resistor coupled between said emitter of said ninth transistor and said second power supply conductor;
a tenth transistor having a base, an emitter and a collector, said base receiving a third reference voltage;
a fifth resistor coupled between said emitter of said tenth transistor and said first power supply conductor; and
a sixth resistor coupled between said emitter of said eighth transistor and said collector of said tenth transistor.

14. The operational amplifier of claim 13 wherein said differential input stage further includes:
- an eleventh transistor having a base, an emitter and a collector, said base receiving said second input signal, said collector being coupled to said second node;
- a twelfth transistor having a base, an emitter and a collector, said base receiving said second reference voltage, said collector being coupled to said first node;
- a seventh resistor coupled between said emitter of said twelfth transistor and said second power supply conductor; and
- an eighth resistor coupled between said emitter of said eleventh transistor and said collector of said tenth transistor.

15. An operational amplifier, comprising:
- a differential input stage responsive to first and second input signals for developing first and second voltages at first and second nodes;
- a first transistor having a base, an emitter and a collector, said emitter being coupled to an output of the operational amplifier, said collector being coupled to a first power supply conductor;
- a second transistor having a base, an emitter and a collector, said collector being coupled to said first node;
- a first resistor coupled between said emitter of said second transistor and said first power supply conductor;
- a third transistor having a base, an emitter and a collector, said base and collector being coupled to said base of said second transistor;
- a fourth transistor having a base, an emitter and a collector, said base being coupled to said collector of said second transistor, said collector being coupled to said base of said first transistor, said emitter being coupled to said collector of said third transistor;
- a third resistor coupled between said emitter of said third transistor and said first power supply conductor;
- a fifth transistor having a base, an emitter and a collector, said base being coupled to said emitter of said third transistor, said collector being coupled to said base of said first transistor; and
- a third resistor coupled between said emitter of said fifth transistor and said first power supply conductor.

16. The operational amplifier of claim 15 further including:
- a sixth transistor having a base, an emitter and a collector, said base receiving a first reference voltage, said emitter being coupled to said second node;
- a seventh transistor having a base, an emitter and a collector, said base receiving said first reference voltage, said emitter being coupled to said first node, said collector being coupled to said collector of said second transistor; and
- an eighth transistor having a base, an emitter and a collector, said base being coupled to said collector of said sixth transistor, said collector being coupled to a second power supply conductor, said emitter being coupled to said output of the operational amplifier.

17. The operational amplifier of claim 16 further including:
- a first diode having an anode coupled to said base of said eighth transistor and having a cathode; and
- a second diode having an anode coupled to said cathode of said first diode and having a cathode coupled to said base of said first transistor.

18. The operational amplifier of claim 17 wherein said differential input stage includes:
- a ninth transistor having a base, an emitter and a collector, said base receiving said first input signal, said collector being coupled to said first node;
- a tenth transistor having a base, an emitter and a collector, said base receiving a second reference voltage, said collector being coupled to said first node;
- a fourth resistor coupled between said emitter of said tenth transistor and said second power supply conductor;
- an eleventh transistor having a base, an emitter and a collector, said base receiving a third reference voltage;
- a fifth resistor coupled between said emitter of said eleventh transistor and said first power supply conductor; and
- a sixth resistor coupled between said emitter of said ninth transistor and said collector of said eleventh transistor.

19. The operational amplifier of claim 18 wherein said differential input stage further includes:
- a twelfth transistor having a base, an emitter and a collector, said base receiving said second input signal, said collector being coupled to said second node;
- a thirteenth transistor having a base, an emitter and a collector, said base receiving said second reference voltage, said collector being coupled to said second node;
- a seventh resistor coupled between said emitter of said thirteenth transistor and said second power supply conductor; and
- an eighth resistor coupled between said emitter of said twelfth transistor and said collector of said eleventh transistor.

* * * * *